United States Patent [19]
Kumagai

[11] Patent Number: 5,585,650
[45] Date of Patent: Dec. 17, 1996

[54] SEMICONDUCTOR BIDIRECTIONAL SWITCH AND METHOD OF DRIVING THE SAME

[75] Inventor: Naoki Kumagai, Nagano, Japan

[73] Assignee: Fuji Electric Co., Ltd., Tokyo, Japan

[21] Appl. No.: 512,381

[22] Filed: Aug. 8, 1995

[30] Foreign Application Priority Data

Aug. 8, 1994 [JP] Japan .................................. 6-185704

[51] Int. Cl.[6] .................................................. H01L 29/74
[52] U.S. Cl. ........................... 257/124; 257/119; 257/133; 257/139; 257/140; 257/146; 257/153; 257/167; 257/355; 257/339
[58] Field of Search ............................... 257/110, 119, 257/133, 139, 140, 146, 153, 167, 355, 339

[56] References Cited

U.S. PATENT DOCUMENTS 4,947,226  8/1990  Huang et al. ............................ 257/124

OTHER PUBLICATIONS

"Insulated-Gate Planar Thyristors: II-Quantitative Modeling" by Scharf et al.; IEEE Transactions on Electron Devices, vol. ED-27, No. 2, Feb. 1980; pp. 387–394.

Primary Examiner—Edward Wojciechowicz
Attorney, Agent, or Firm—Brumbaugh, Graves, Donohue & Raymond

[57] ABSTRACT

High withstand voltage, low on-voltage, low turn-off loss, and high switching speed are realized in semiconductor bidirectional switches in which the potential of the substrate is floating. A switch has a p-type substrate without an electrode, and an n-layer on the substrate. At least one pair of p-well regions and at least one p-region are formed in a surface layer of the n-layer. An n[+] region is formed in the p-well region, and a gate electrode is fixed via an insulation film to the p-well region. A main electrode is fixed to a part of the surface of the n[+] region and the surface of a p[+] contact region in the p-well region.

4 Claims, 4 Drawing Sheets

SEMICONDUCTOR BIDIRECTIONAL SWITCH AND METHOD OF DRIVING THE SAME

BACKGROUND OF THE INVENTION

The present invention relates to voltage-driven self-quenching type semiconductor bidirectional switches as used, e.g., in electric power converters.

FIG. 5 is a cross-sectional view of a prior-art voltage-driven self-quenching type semiconductor bidirectional switch known as "TRIMOS" and described in IEEE TRANSACTIONS ON ELECTRON DEVICES, Vol. ED-27, No. 2, pp. 380–387. This device may be interpreted as having a structure that comprises lateral metal-oxide-semiconductor field-effect transistors (MOSFETs) in reverse series connection, and as operating as a bidirectional MOS thyristor. The first p-type well region (p-well region) 31 and the second p-type well region 32 are formed in the upper part of an n-type semiconductor layer (n$^-$ layer) 2. A heavily doped n-type semiconductor region (n$^+$ region) 41 is formed in the upper part of the p-well region 31. A heavily doped n-type semiconductor region (n$^+$ region) 42 is formed in the upper part of the p-well region 32. A heavily doped p-type contact region (p$^+$-contact region) 51 is formed in the p-well region 31 contacting the n$^+$ region 41. A heavily doped p-type contact region (p$^+$-contact region) 52 is formed in the p-well region 32 contacting the n$^+$ region 42. An intermediately doped n-type semiconductor region (n region) 12 is formed in the upper central part of the n$^-$ layer 2 between the p-wells 31 and 32. A gate electrode 71 is fixed via an insulation film (gate oxide film) to the portion of the p-well region 31 extending between the n$^+$ region 41 and the n$^-$ layer 2. A gate electrode 72 is fixed via an insulation film (gate oxide film) to the portion of the p-well region 32 extending between the n$^+$ region 42 and the n$^-$ layer 2. These gate electrodes 71 and 72 are connected to a common gate terminal G. The first main electrode 81 is fixed to the p$^+$-contact region 51. The second main electrode 82 is fixed to the p$^+$-contact region 52. The main electrodes 81 and 82 are connected to main terminals T1 and T2, respectively. The n$^-$ layer 2 functions as a drift region of carriers (electrons or holes).

The structure described above may be considered as including lateral MOSFETs in reverse series connection, and also as a bidirectional IGBT or a bidirectional thyristor, as its operation includes a bipolar mode.

When the first main electrode 81 is biased with a negative potential, and the second main electrode 82 with a positive potential, the following conditions arise: An inversion layer is formed in the surface of the p-well region 31 under the gate electrode 81, and electrons are injected from the n$^+$ region 41 to the n$^-$ layer 2 when a voltage which is positive with respect to the main electrode 81 and higher than the threshold value is applied to the gate terminal G. This inversion layer is usually called "channel". In association with electron injection, holes are injected from the p-well region 32 located on the side of the second main electrode 82. The injected hole current flows in the p-well region 31 to cause a potential drop by the resistance of the p-well region 31. A junction between the p-well region 31 and the n$^+$ region 41 is biased in the forward direction by the potential drop, causing further electron injection from the n$^+$ region 41. Thus, the device maintains its ON state without application of a voltage higher than the threshold value to the gate terminal G, and it operates in the thyristor mode.

Since the main electrodes T1 and T2 are arranged mutually symmetrical, the device also can be used as a bidirectional switch.

FIG. 6 is a cross-sectional view of a prior-art unidirectional high withstand voltage switch. As shown in FIG. 6, this device has a so-called reach-through type structure that comprises regions corresponding to the n region 12 of FIG. 5, which surround the p-well region to shorten the n$^-$ layer 2.

Again with reference to FIG. 5, if one wants to realize a high withstand voltage in the device, it is necessary to provide the n$^-$ layer 2 with high resistivity. However, when the n$^-$ layer 2 has high resistivity, a depletion layer edge 13 advances beyond the n region 12 meant to function as a stopper of the depletion layer. The advancing depletion layer edge 13 reaches the p-well region 32 on the high potential side to cause the so-called punch-through phenomenon. Thus, the device can no longer maintain its blocking state. If the n$^-$ layer 2 is elongated to overcome the above-described problem, the drift path of the charged particles is also elongated, increasing the on-voltage of the device.

To reduce the on-voltage of devices which operate in the bipolar mode, these are usually designed to have reach-through type structure as shown in FIG. 6. With the n region 12 functioning as a depletion layer stopper, the punch-through phenomenon is prevented while the n$^-$ layer 2 is shortened. However, the n region 12 disposed around the p-well region 32 increases the gate threshold value. Since an abnormally high voltage has to be applied to the gate electrode to turn on the device, the structure of FIG. 6 is not practical for bipolar switches.

Since the gate electrodes 71 and 72 are connected in common, the potential difference between the other main electrode T2 and the gate electrode 82 is increased, causing breakdown of the gate oxide film when the gate electrode is biased with respect to the main electrode T1 on the reference potential side. Thus, the prior-art devices are not suitable for high withstand voltage applications, and their application is limited to an intermediate withstand voltage range.

SUMMARY OF THE INVENTION

It is an object of the present invention to provide a high-performance semiconductor bidirectional switch having high withstand voltage, low on-voltage, low turn-off loss, and high-speed switching, and a method of driving the bidirectional switch.

A preferred first semiconductor bidirectional switch comprises: a semiconductor substrate of first conductivity type, the potential thereof being floating; a semiconductor layer of second conductivity type formed on the semiconductor substrate; at least one pair of well regions of the first conductivity type formed in a surface layer of the semiconductor layer; heavily doped semiconductor regions of the second conductivity type formed in surface layers of the first and second well regions; at least one semiconductor region of the first conductivity type formed in a surface layer of the portion of the semiconductor layer extending between the first and second well regions; a first gate electrode being fixed via an insulation layer to the portion of the first well region extending between the semiconductor layer and the heavily doped semiconductor region formed in the first well region; a second gate electrode being fixed via an insulation layer to a portion of the second well region extending between the semiconductor layer and the heavily doped semiconductor region formed in the second well region; a first main electrode for electrically connecting the first well region and the heavily doped semiconductor region formed in the first well region; and a second main electrode for electrically connecting the second well region and the heavily doped semiconductor region formed in the second well region.

A preferred second semiconductor bidirectional switch comprises: a semiconductor substrate of first conductivity type, the potential thereof being floating; a semiconductor layer of second conductivity type formed on the semiconductor substrate; at least one pair of well regions of the first conductivity type being formed in a surface layer of the semiconductor layer; heavily doped semiconductor regions of the second conductivity type being formed in surface layers of the first and second well regions; at least one semiconductor region of the first conductivity type being formed in a surface layer of the portion of the semiconductor layer extending between the first and second well regions; a first gate electrode being fixed via an insulation layer to a first portion of the semiconductor layer extending between the at least one semiconductor region nearest to the first well region and the first well region, and the portion of the first well region extending between the first portion of the semiconductor layer and one of the heavily doped semiconductor regions formed in the first well region; a second gate electrode being fixed via an insulation layer to a second portion of the semiconductor layer extending between the at least one semiconductor region nearest to the second well region and the second well region, and the portion of the second well region extending between the second portion of the semiconductor layer and one of the heavily doped semiconductor regions formed in the second well region; a first main electrode for electrically connecting the first well region and the heavily doped semiconductor regions being formed in the first well region; and a second main electrode for electrically connecting the second well region and the heavily doped semiconductor regions being formed in the second well region.

The semiconductor bidirectional switches described above are driven by a preferred method which comprises the steps of: applying a voltage higher than a gate threshold value to the first gate electrode; waiting for zero or a predetermined period of delay time; applying a voltage lower than the gate threshold value to the second gate electrode to turn on the semiconductor bidirectional switch; applying a voltage higher than the gate threshold value to the second gate electrode; waiting for zero or a predetermined period of delay time; and applying a voltage lower than the gate threshold value to the first gate electrode to turn off the semiconductor bidirectional switch.

The second semiconductor bidirectional switch, having extended gate electrodes, can be driven also by a preferred further method which comprises the steps of: applying a voltage higher than a gate threshold value to the first gate electrode; waiting for zero or a predetermined period of delay time; applying a voltage for forming an inversion layer in the surface of the semiconductor layer to the second gate electrode to turn on the semiconductor bidirectional switch; applying a voltage higher than the gate threshold value to the second gate electrode; waiting for zero or a predetermined period of delay time; and applying a voltage lower than the gate threshold value to the first gate electrode to turn off the semiconductor bidirectional switch.

Hereinafter, the semiconductor bidirectional switch is referred to as "device," the first conductivity type is represented by "p-type", and the second conductivity type by "n-type". In the devices described above, the potential of the p-type substrate ($p^-$ substrate) is floating. In such devices, when the edge of the depletion layer expanding from the p-well region located on the low potential side reaches the $p^-$ substrate, the potential of the $p^-$ substrate has an intermediate value between the low and high potential values of the main electrodes. The depletion layer also expands into the $p^-$ substrate. Thus, the depletion layer edge advances less deeply from the $p^-$ substrate into the $n^-$ layer in comparison with the devices in which the $p^-$ substrate is electrically connected with the p-well region located on the low potential side, or with the devices which do not have any $p^-$ substrate. Since the depletion layer hardly reaches the p-well region located on the high potential side and the so-called punch-through phenomenon hardly occurs, the device can be provided with a high withstand voltage. Moreover, the device is turned on in the so-called bipolar mode with a low on-voltage by turning on the flow potential side MOSFET to inject holes from the high voltage side p-well region to the $n^-$ layer. The device is turned off in the unipolar mode with low turn-off loss and high switching speed by turning on the high potential side MOSFET to stop the hole injection from the high voltage side p-well region to the $n^-$ layer.

When the potential of the first main electrode is lower than the potential of the second main electrode, the devices are turned on through the following steps: First, the low potential side MOSFET is turned on by applying a voltage higher than the gate threshold value to the first gate electrode. Then, the high potential side MOSFET is turned off to inject the minority carriers by applying a voltage lower than the gate threshold value to the second gate electrode after waiting for zero or a predetermined period of delay time. The devices are turned off through the following steps: First, the high potential side MOSFET is turned on to stop the minority carrier injection by applying a voltage higher than the gate threshold value to the second gate electrode. Then, the low potential side MOSFET is turned off by applying a voltage lower than the gate threshold value after waiting for zero or a predetermined period of delay time.

In the device in which the gate electrodes are extended to above the portions of the $n^-$ layer extending between the p-well region and the p region, the on-voltage is further lowered by the additional minority carrier injection from the p region enhanced by applying a voltage sufficient for creating an inversion layer on the $n^-$ layer.

When the potential of the first main electrode is higher than the potential of the second main electrode, the device is operated in the same manner by interchanging the roles of the first and second main electrodes.

DETAILED DESCRIPTION OF PREFERRED EMBODIMENTS

Figure 1A:
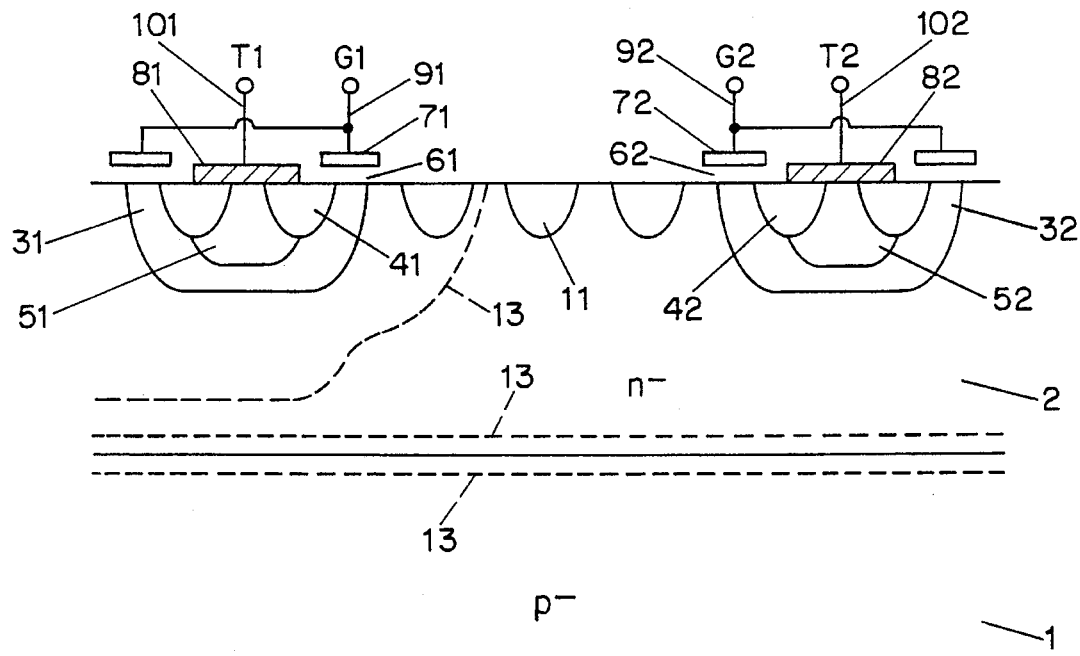
FIGS. 1(*a*) and 1(*b*) are cross sections illustrating expansion of a depletion layer in the first embodiment of the present invention.

In FIGS. 1(*a*) and 1(*b*), depletion layer edges are shown by broken lines. The device has a $p^-$ substrate 1 with resistivity of 100 Ωcm on which is formed an n⁻ layer 2. The n⁻ layer 2 is formed to a thickness of 5 μm by implanting phosphorus (P) ions at a dose of 6×10¹²/cm², and by subsequent heat treatment (thermal diffusion). Two p-well regions 31, 32, and a plurality of p-type semiconductor regions (p regions) 11 are formed by implanting boron (B) ions from the surface of the n⁻ layer 2 at a dose of 1×10¹³/cm². Heavily doped p-type contact regions (p⁺ contact regions) 51 and 52 are formed by implanting boron (B) ions from the surface of the n⁻ layer 2 at a dose of 8×10¹³/cm². An n⁺ region 41 is formed by implanting arsenic (As) ions from the surface of the p-well region 31 at a dose of 10¹⁵/cm². An n⁺ region 42 is formed by implanting arsenic (As) ions from the surface of the p-well region 32 at a dose of 10¹⁵/cm². The depth of each region is adjusted by heat treatment subsequent to ion implantation. A gate electrode 71 is fixed via an insulation film 61 to the portion of the p-well region 31 extending between the n⁺ region 41 and the n⁻ layer 2. The insulation film 61 comprises an oxide film or a nitride film 250 Å thick. The gate electrode 71 comprises a poly-crystalline silicon film 4500 Å thick. A gate electrode 72 is fixed via an insulation film 62 to the portion of the p-well region 32 extending between the n⁺ region 42 and the n⁻ layer 2. The insulation film 62 comprises an oxide film or a nitride film 250 Å thick. The gate electrode 72 comprises a poly-crystalline silicon film 4500 Å thick. An aluminum (Al) main electrode 81 is disposed on the surface of the p⁺ contact region 51 and a part of the surface of the n⁺ region 41. An aluminum (Al) main electrode 82 is disposed on the surface of the p⁺ contact region 52 and a part of the surface of the n⁺ region 42. The p⁺ contact regions 51 and 52 are optional. A gate terminal (G1) 91 is connected to the gate electrode 71, and a main terminal (T1) 101 to the main electrode 81. A gate terminal (G2) 92 is connected to the gate electrode 72, and a main terminal (T2) 102 to the main electrode 82.

Figure 1B:
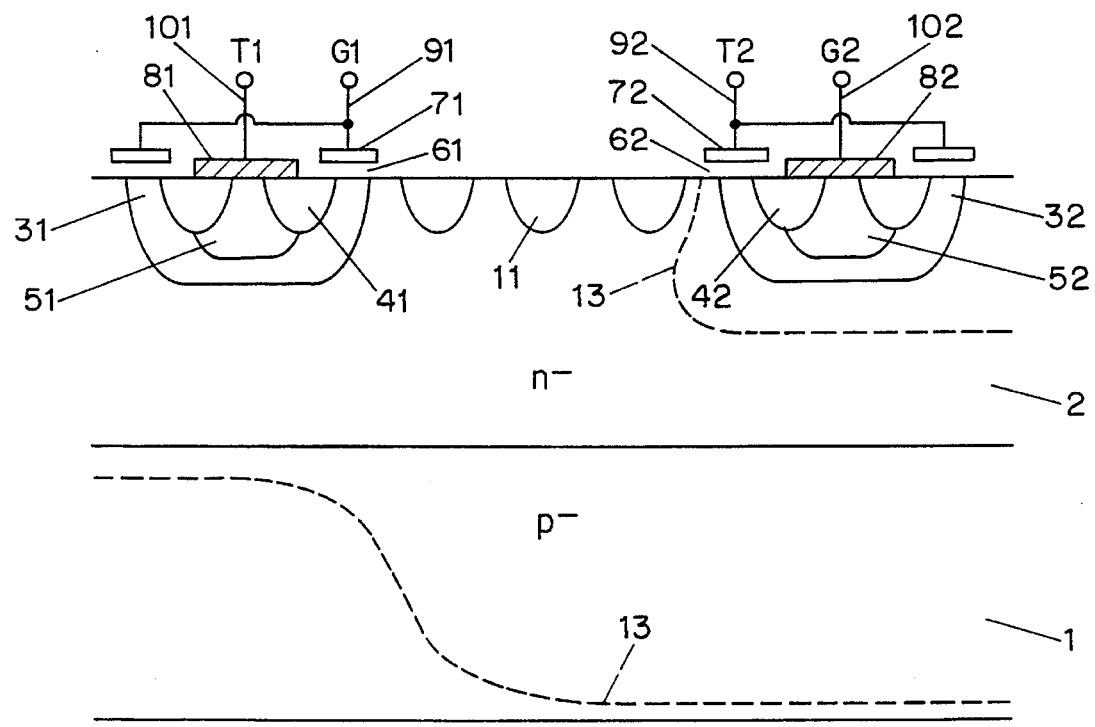
Figure 5:
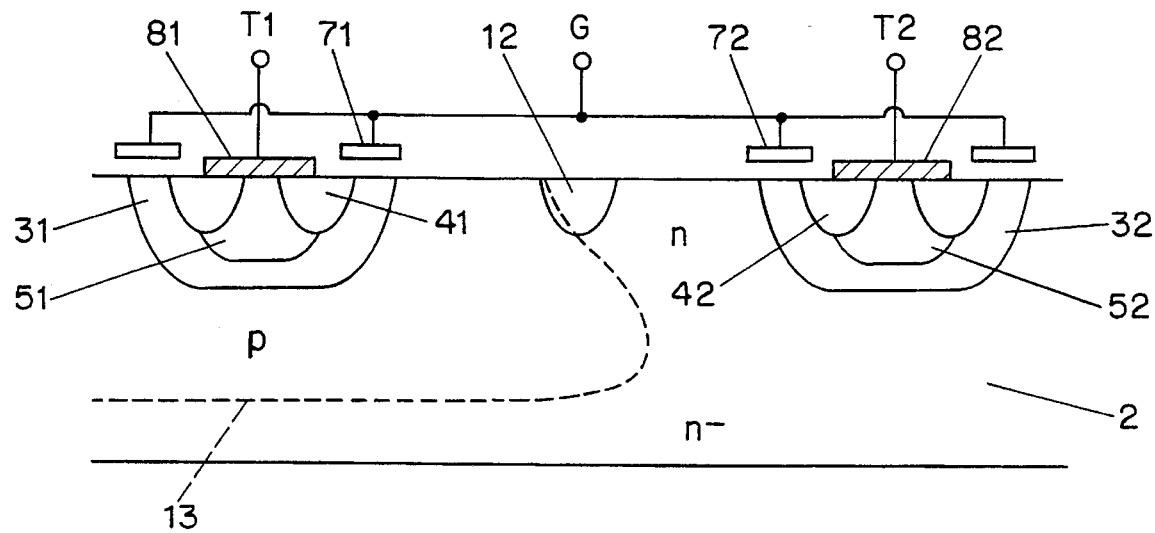
FIG. 5 is a cross section of a prior-art bidirectional switch.
Figure 6:
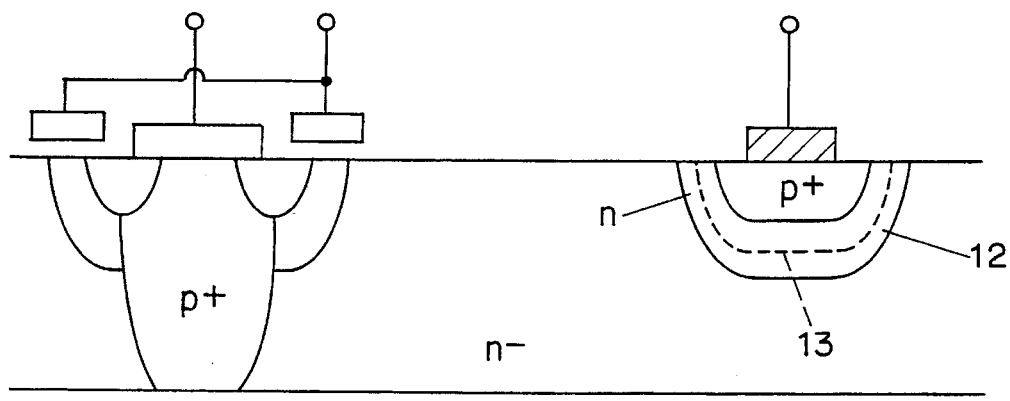
FIG. 6 is a cross section of a prior-art unidirectional switch.

The first embodiment differs from the prior-art device of FIG. 5 as follows: First, the n⁻ layer 2 is on a p⁻ substrate, and the potential of the p⁻ substrate below the n⁻ layer 2 in FIGS. 1(a) and 1(b) is floating. That is, the device does not have any electrode for fixing the potential of the substrate 1. Second, a plurality of p-type semiconductor regions (p regions) 11 are formed in the surface layer of the n⁻ layer 2 in place of the n region 12 of FIG. 5. Third, the gate electrodes 71 and 72 are separated from one another and are connected to the gate terminals G1 and G2, respectively.

The broken lines in FIGS. 1(a) and 1(b) indicate the edges 13 of the depletion layer when the main electrode 81 is biased with a low potential and the main electrode 82 with a high potential. FIG. 1(a) illustrates a state in which the potential difference between the main electrodes is relatively small. In FIG. 1(a), the edge 13 of the depletion layer expanding from the p-well region 31 has not yet reached the p⁻ substrate 1. Since the substrate potential is floating, the substrate potential follows the potential of the n⁻ layer 2 which is not depleted. The potential of the edges 13 of the depletion layer straddling the junction between the p⁻ substrate 1 and the n⁻ layer 2 is equal to the potential in thermal equilibrium. FIG. 1(b) illustrates a state in which the potential difference is large. In FIG. 1(b), the potential barrier formed between the p⁻ substrate 1 and the n⁻ layer 2 is lowered as soon as the depletion layer edge 13 reaches the p⁻ substrate 1 to cause the so-called punch-through phenomenon. Holes flow from the p⁻ substrate 1 into the p-well region 31 through the depleted n⁻ layer 2 by the punch-through phenomenon. In association with this, a depletion layer is created in a region in which the holes are depleted. This region is created in the p⁻ substrate 1. As a result, the potential of the p⁻ substrate 1 does not follow the potential of the n⁻ layer 2 which is not depleted any more. As the potential difference between the main electrodes increases further, the potential of the p⁻ substrate 1 becomes lower (though still rising) than the rising potential of the n⁻ layer 2. This potential difference drives the depletion layer edges 13 into the p⁻ substrate 1 and the n⁻ layer 2. The depletion layer edge 13 on the side of the p⁻ substrate 1 advances not very deeply into the portion of the p⁻ substrate 1 underneath the p-well region 31 located on the low potential side. In contrast, the depletion layer edge 13 on the side of the p⁻ substrate 1 advances deeply into the portion of the p⁻ substrate 1 underneath the p-well region 32 located on the high potential side.

Though the depletion layer edge 13 advances deeply into the portion of the p⁻ substrate 1 underneath the p-well region 32, the potential difference between the p⁻ substrate 1 and the p-well region 32 is small in comparison with the case in which the p⁻ substrate 1 is fixed at low potential by an electrical connection with the p-well region 31 located on the low potential side. And, the depletion layer edge 13 advances less deeply in the n⁻ layer 2 underneath the p-well region 32. This is because the potential of the p⁻ substrate 1 is higher than that of the p-well region 31. As a result, the depletion layer edge 13 advancing from the p⁻ substrate 1 is prevented from reaching the p-well region 32 on the high potential side, and the punch-through phenomenon is prevented.

Since the potential of the p regions 11 formed in the n⁻ layer 2 is floating as the potential of the p⁻ substrate 1, the potential of the p regions 11 takes an intermediate value between the potential values of the n⁻ layer 2 and the p-well region 31. The potential difference drives the depletion layer edge 13 into the n⁻ layer 2. When the advancing depletion layer edge 13 links with the edge 13 of the depletion layer expanding from the p⁻ substrate 1, the n⁻ layer 2 except the peripheral region around the p-well region 32 located on the high potential side is completely depleted to be able to sustain a high voltage. When the area of the not-depleted n⁻ layer 2 is narrow, the current amplification factor of a pnp-transistor consisting of the p-well region 31, n⁻ layer 2, and p-well region 32 may become high to cause withstand voltage lowering. However, the current amplification factor can be lowered and the withstand voltage can be prevented from being lowered by turning on the high potential side MOSFET located on the side of the main electrode 82 for short-circuiting the n⁻ layer 2 and the p-well region 32 to suppress the hole injection. The high potential side MOSFET is turned on by biasing the gate electrode 72 with a potential positive with respect to the main electrode 82. Since the device has a symmetrical structure having the main electrodes 81 and 82, the device can sustain a high voltage even when the potential relation between the main electrodes 81 and 82 is reversed.

The device is turned on by biasing the gate electrode 71 with a potential which is positive with respect to the main electrode 81, when the main electrode 81 is biased with a low potential and the main electrode 82 with a high potential, to turn on the low potential side MOSFET. At this time, if the gate on the side of the main electrode 82 is in the OFF state, electrons injected from the low potential side MOSFET supply a base current to the pnp transistor consisting of the p-well region 31, n⁻ layer 2, and p-well region 32. Holes are injected by the base current from the p-well region 32. Thus, the device is capable of bipolar operation, e.g., IGBT operation or thyristor operation, so long as the gate on the side of the main electrode 82 is in the off-state. If the gate on the side of the main electrode 82 is in the ON state, the base current of the pnp transistor is bypassed through the high potential side MOSFET. Without hole injection, the device is capable of unipolar operation, i.e., MOSFET operation. The device operates in the IGBT mode or the thyristor mode at which the on-voltage is low in the stationary on-state, and is changed over, immediately before turn-off, to the MOSFET mode at which the turn-off loss is low. Thus, the device simultaneously realizes low on-voltage and low turn-off loss, and facilitates switching at high speed.

Figure 2:
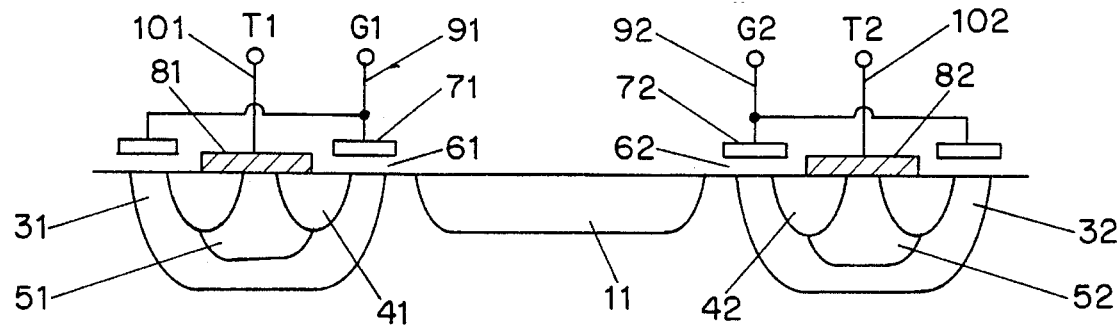
FIG. 2 is a cross section of the second embodiment of the present invention.

In FIG. 2, parts like those of FIGS. 1(a) and 1(b) are designated by the same reference numerals. This second embodiment differs from the first embodiment in that the device of FIG. 2 comprises one p region 11 instead of a plurality of the p regions 11. Since there is a neutral region in the p region, an electric field concentration lowers the withstand voltage when an equi-potential region spreads laterally. To avoid this problem, it is necessary to carefully choose the impurity concentration and diffusion depth of the p region 11 so that the p region 11 may be fully depleted at the maximum applied voltage.

Figure 3:
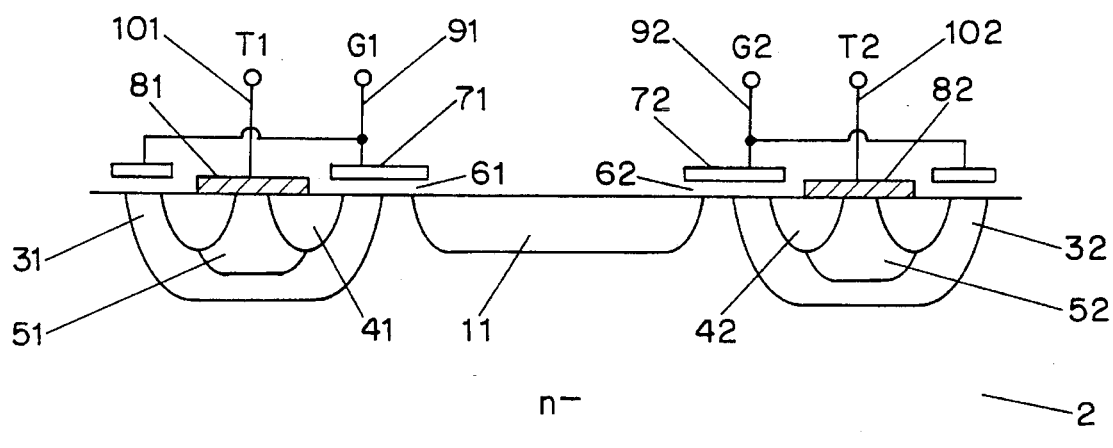
FIG. 3 is a cross section of the third embodiment of the present invention.

In FIG. 3, parts like those of FIGS. 1(a), 1(b) and 2 are designated by the same reference numerals. This third embodiment differs from the second embodiment of FIG. 2 in that the gate electrodes 71 is extended on the insulation film 61 over the portion of the n⁻ layer 2 extending between the p-well region 31 and the p region 11 to a portion of the p region 11, and the gate electrode 72 is extended on the insulation film 62 over the portion of the n⁻ layer 2 extending between the p-well region 32 and the p region 11 to a portion of the p region 11. By biasing the gate electrode 72 on the high potential side with a potential which is negative with respect to the main electrode 82 on the high potential side during the on-period of the device, an inversion layer is created on the surface of the n⁻ layer 2 to connect the p-well region 32 on the high voltage side with the p region 11. By connecting the p-well region 32 with the p region 11 through the inversion layer, hole injection from the p region 11 is facilitated and a lower on-voltage is obtained. Also, the carrier life time in the n⁻ layer 2 is shortened and high speed switching is facilitated.

Figure 4:
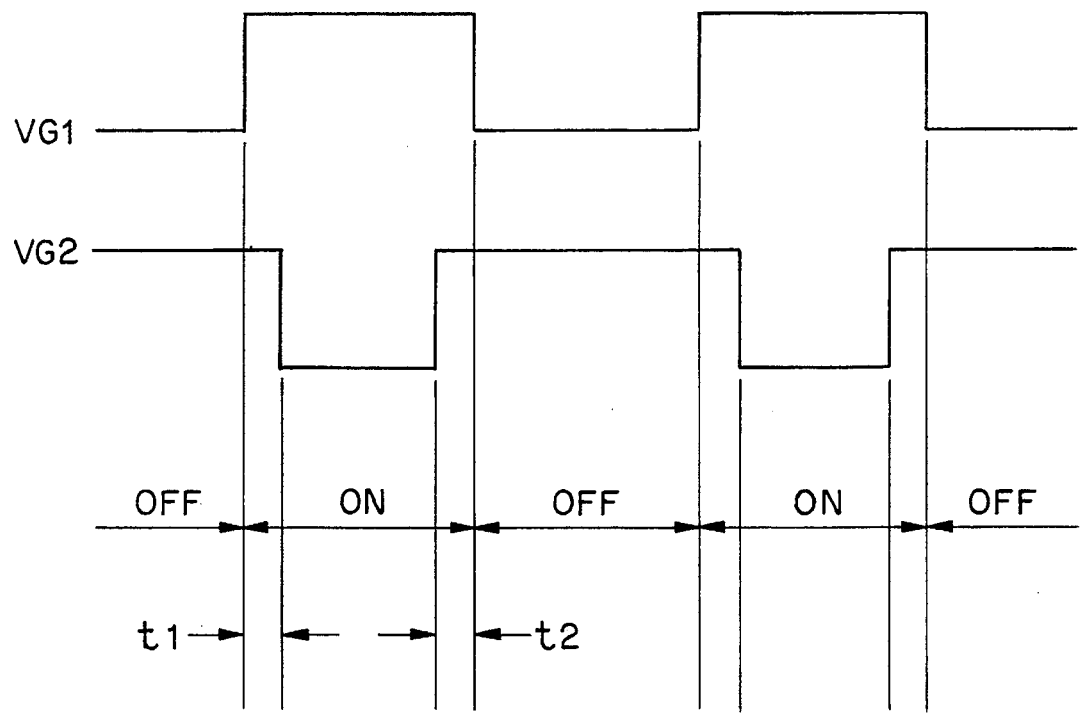
FIGS. 4(*a*) and 4(*b*) are timing charts for a gate driving method for the devices of the present invention.
Figure 4:
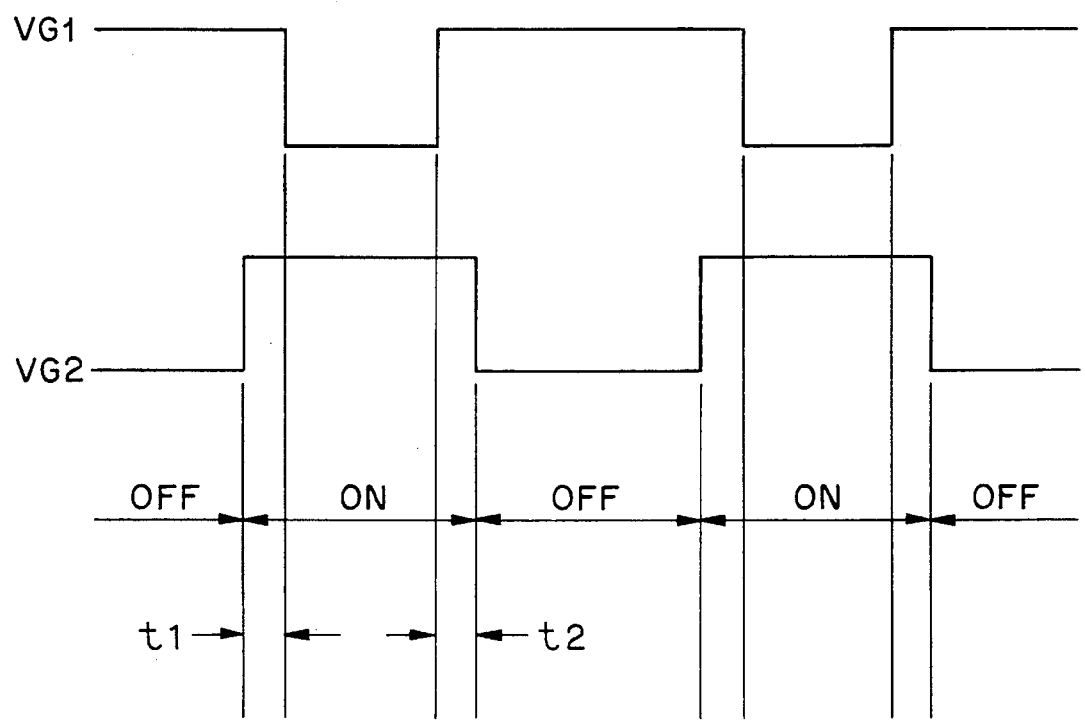

FIG. 4(a) illustrates timing for the case in which the potential of the main electrode 81 is lower than the potential of the main electrode 82. In the initial state the device is non-conductive, with the potential VG1 of the gate electrode 71 lower than the gate threshold value, and the potential VG2 of the gate electrode 72 higher than the gate threshold value. The device is turned on by the following steps: First, the potential VG1 is boosted above the gate threshold value to form a channel in the p-well region 31. After waiting for a delay time τ1, the channel formed in the p-well region 32 is eliminated by lowering the potential VG2 below the gate threshold value to enhance hole injection from the p-well region 32 to the n⁻ layer 2. The device is turned off through the following steps: A channel is formed in the p-well region 32 by raising the potential VG2 above the gate threshold value to stop the hole injection from the p-well region 32. After waiting for a delay time τ2, the channel formed in the p-well region 31 is eliminated by lowering the potential VG1 below the gate threshold value to stop the electron injection. Though the change-over delay times τ1 and τ2 may be zero, the turn-off loss is further reduced by setting τ2 at from 100 ns to 1 μs to turn off the device after the minority carriers injected during the on-period are swept out.

The driving method described above may be applied to the first, second and third embodiments. However, a driving method may be adopted for the third embodiment, which method adopts VG2 sufficient for creating an inversion layer in the n⁻ layer 2 in place of the VG2 lower than the gate threshold value. By creating the inversion layer in the n⁻ layer 2 for connecting the p-well region 32 and the p region 11, hole injection from the p region 11 to the n⁻ layer 2 is added to further reduce the on-voltage during the turning-on of the device.

FIG. 4(b) illustrates timing the case in which the potential of the main electrode 81 is higher than the potential of the main electrode 82. By reversing the roles of the main gate electrodes 81 and 82, operation is realized similar to FIG. 4(a).

When a device has an n-type substrate, and the conductivity type of each layer or each region formed on the substrate is different from that in the devices described above, similar operation can be realized by reversing the potential relations.

With reference to FIG. 3, the third embodiment has one p region 11. However, a plurality of p regions may be included. In the third embodiment thus modified, the gate electrode 71 is extended on the gate oxide film 61 to above the p region 11 nearest to the p-well region 31, and the gate electrode 72 is extended on the gate oxide film 62 to above the p region 11 nearest to the p-well region 32.

Symmetrical structure of the devices of the present invention facilitates bidirectional switching, and provides symmetrical characteristics in the forward and reverse directions. The present devices sustain the withstand voltage by the n⁻ region commonly in the forward and reverse directions, with floating potential of the semiconductor substrate. Thus, the present devices facilitate realizing a bidirectional high withstand voltage by the short n⁻ region, and a low on-voltage by the bipolar mode during the turning-on of the devices. The present devices also facilitate switching at high speed with low turn-off loss by operating in the quasi-unipolar mode during the turning-off of the device, and by shortening the carrier lifetime in the n⁻ region.

I claim:

1. A semiconductor bidirectional switch comprising:

a semiconductor substrate of a first conductivity type, the potential thereof being floating;

a semiconductor layer of a second conductivity type formed on the semiconductor substrate, the semiconductor layer having a first surface layer;

at least one pair of a first and a second well regions of the first conductivity type formed in the first surface layer of the semiconductor layer, each of the well regions having a second surface layer;

heavily doped semiconductor regions of the second conductivity type formed in the second surface layers of the first and second well regions;

at least one semiconductor region of the first conductivity type formed in the first surface layer of a portion of the semiconductor layer extending between the first and second well regions;

a first gate electrode fixed via an insulation layer to a first portion of the first well region extending between the semiconductor layer and the heavily doped semiconductor region formed in the first well region;

a second gate electrode fixed via an insulation layer to a second portion of the second well region extending between the semiconductor layer and the heavily doped semiconductor region formed in the second well region;

a first main electrode for electrically connecting the first well region and the heavily doped semiconductor region formed in the first well region; and a second main electrode for electrically connecting the second well region and the heavily doped semiconductor region formed in the second well region.

2. A semiconductor bidirectional switch comprising:

a semiconductor substrate of a first conductivity type, the potential thereof being floating;

a semiconductor layer of a second conductivity type formed on the semiconductor substrate, the semiconductor layer having a first surface layer;

at least one pair of a first and a second well regions of the first conductivity type formed in the first surface layer of the semiconductor layer, each of the well regions having a second surface layer;

heavily doped semiconductor regions of the second conductivity type formed in the second surface layers of the first and second well regions;

at least one semiconductor region of the first conductivity type formed in the first surface layer of a portion of the semiconductor layer extending between the first and second well regions;

the first gate electrode is fixed via an insulation layer to the first portion of the semiconductor layer extending between the at least one semiconductor region nearest to the first well region and the first well region, and a portion of the first well region extending between the first portion of the semiconductor layer and the heavily doped semiconductor region formed in the first well region; and the second gate electrode is fixed via an insulation layer to the second portion of the semiconductor layer extending between the at least one semiconductor region nearest to the second well region and the second well region, and a portion of the second well region extending between the second portion of the semiconductor layer and the heavily doped semiconductor region formed in the second well region;

a first main electrode for electrically connecting the first well region and the heavily doped semiconductor region formed in the first well region; and a second main electrode for electrically connecting the second well region and the heavily doped semiconductor region formed in the second well region.

3. A method of driving the semiconductor bidirectional switch of claim 1 or 2, comprising the steps of:

applying a voltage higher than a gate threshold value to the first gate electrode;

waiting for zero or a predetermined period of delay time;

applying a voltage lower than the gate threshold value to the second gate electrode, whereby the semiconductor bidirectional switch is turned on;

applying a voltage higher than the gate threshold value to the second gate electrode;

waiting for zero or a predetermined period of delay time; and applying a voltage lower than the gate threshold value to the first gate electrode, whereby the semiconductor bidirectional switch is turned off.

4. A method of driving the semiconductor bidirectional switch of claim 2, comprising the steps of:

applying a voltage higher than a gate threshold value to the first gate electrode;

waiting for zero or a predetermined period of delay time;

applying a voltage sufficient for forming an inversion layer in the first surface of the semiconductor layer to the second gate electrode, whereby the semiconductor bidirectional switch is turned on;

applying a voltage higher than the gate threshold value to the second gate electrode;

waiting for zero or a predetermined period of delay time; and applying a voltage lower than the gate threshold value to the first gate electrode, whereby the semiconductor bidirectional switch is turned off.

\* \* \* \* \*